(12) United States Patent
Scheuerlein

(10) Patent No.: US 7,465,951 B2
(45) Date of Patent: Dec. 16, 2008

(54) WRITE-ONCE NONVOLATILE PHASE CHANGE MEMORY ARRAY

(75) Inventor: Roy E. Scheuerlein, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 246 days.

(21) Appl. No.: 11/040,256

(22) Filed: Jan. 19, 2005

(65) Prior Publication Data

US 2006/0157682 A1 Jul. 20, 2006

(51) Int. Cl.
*H01L 47/00* (2006.01)
(52) U.S. Cl. .............................. 257/3; 257/41; 257/42
(58) Field of Classification Search ................. 257/2–5, 257/41, 42, E45.002; 438/95; 365/163
See application file for complete search history.

(56) References Cited

U.S. PATENT DOCUMENTS

2006/0013037 A1* 1/2006 Li et al. ....................... 365/163
2007/0238226 A1* 10/2007 Lowrey ....................... 438/131

* cited by examiner

*Primary Examiner*—Thien F Tran
(74) *Attorney, Agent, or Firm*—Tyler Thorp

(57) ABSTRACT

The invention provides for a write-once nonvolatile memory array, the memory cells comprising a phase change material, such as a chalcogenide. Phase change is achieved in chalcogenide memories by thermal means. The initial, unprogrammed state of each memory cell is a crystalline, low-resistance state, while the programmed state is an amorphous, high-resistance state. Optimizing the circuitry for a write-only memory array, the wordlines or bitlines can be long, with at least 256 cells on a wordline or bitline, and in some embodiments, having thousands of cells on a wordline or bitline. In a preferred embodiment, such an array can be a monolithic three dimensional memory array comprising stacked memory levels.

26 Claims, 7 Drawing Sheets

WRITE-ONCE NONVOLATILE PHASE CHANGE MEMORY ARRAY

RELATED APPLICATIONS

This application is related to Scheuerlein, U.S. application Ser. No. 11/040,255, "A Non-Volatile Memory Cell Comprising a Dielectric Layer and a Phase Change Material in Series," to Scheuerlein, U.S. application Ser. No. 11,930,620, "Structure and Method for Biasing Phase Change Memory Array for Reliable Writing," and to Scheuerlein, U.S. application Ser. No. 11/040,465, "A Non-Volatile Phase Change Memory Cell Having a Reduced Thermal Contact Area," all filed on even date herewith and hereby incorporated by reference.

BACKGROUND OF THE INVENTION

The invention relates to a write-once nonvolatile phase change memory array. In preferred embodiments, such an array can be a monolithic three dimensional memory array of stacked memory levels.

Phase-change materials such as chalcogenides have been used in nonvolatile memories. Such materials can exist in one of two or more stable states, for example a high-resistance and a low-resistance state. In chalcogenides, the high-resistance state corresponds to an amorphous state, while the low-resistance state corresponds to a more ordered crystalline state. The conversion between states is generally achieved thermally.

Accomplishing the phase change from a crystalline state to an amorphous state is achieved by applying a sharp pulse to the phase change material, heating it to high temperature, and allowing rapid cooling. The opposite conversion, from the crystalline state to the amorphous state, requires more careful control, heating the phase-change material to a moderate temperature and cooling it slowly.

This crystalline-to-amorphous conversion becomes increasingly difficult to control as the array increases in size. A need exists, therefore, to form a nonvolatile phase-change memory array having a large array size.

SUMMARY OF THE INVENTION

The present invention is defined by the following claims, and nothing in this section should be taken as a limitation on those claims. In general, the invention is directed to a write-once array of nonvolatile memory cell comprising a phase change element.

A first aspect of the invention provides for a phase change memory cell comprising a phase change element comprising a chalcogenide material, the phase change element having a programmed and an unprogrammed state, wherein the memory cell is a programmable read-only memory cell.

Another aspect of the invention provides for a monolithic three dimensional memory array comprising: a first memory level comprising a plurality of memory cells, each memory cell having a programmed state and an unprogrammed state and comprising a phase change element, each phase change element comprising chalcogenide material, wherein the memory cells are programmable read-only memory cells; and at least a second memory level monolithically formed on the first memory level.

Yet another aspect of the invention provides for a method for forming and programming a one-time programmable array of phase change memory cells, the method comprising forming an array of phase-change memory cells, each memory cells comprising a chalcogenide material, each memory cell having an unprogrammed state and a programmed state; factory-setting the memory cells of the array into the unprogrammed state; and field-programming some of the memory cells into the programmed state, wherein, during the operational lifetime of the array, none of the field-programmed cells is field-reset to the unprogrammed state.

A preferred embodiment of the invention provides for method to form a programmable read-only monolithic three dimensional memory array, the method comprising: forming a plurality of first substantially parallel, substantially coplanar conductors at a first height above a substrate; forming a plurality of second substantially parallel, substantially coplanar conductors at a second height above the first height; forming a plurality of first phase change elements, each comprising a chalcogenide material and disposed between one of the first conductors and one of the second conductors; and forming a plurality of first programmable read-only memory cells, wherein each memory cell comprises a) a portion of one of the first conductors; b) a portion of one of the second conductors; and c) one of the first phase change elements.

Still another aspect of the invention provides for a memory array, the memory array comprising: a first wordline or bitline; and a first plurality of memory cells on the wordline or bitline, wherein the memory cells comprise a chalcogenide material, wherein the plurality of memory cells comprises at least 256 memory cells.

A related preferred embodiment of the invention provides for A monolithic three dimensional memory array comprising: a first memory level, the first memory level comprising a first bitline or wordline, the first memory level comprising: a first plurality of phase change memory cells, each of the first plurality of cells comprising chalcogenide material, wherein the first plurality of memory cells comprises at least 256 memory cells; and a second memory level monolithically formed on the first memory level.

Another preferred embodiment provides for a monolithic three dimensional memory array comprising: a) a first memory level formed above a substrate, the first memory level comprising: i) a first plurality of write-once memory cells, each memory cell of the first plurality comprising chalcogenide material; and ii) a second plurality of rewriteable memory cells, each memory cell of the second plurality comprising chalcogenide material; and b) a second memory level monolithically formed above the first memory level.

A final aspect of the invention provides for a monolithic three dimensional memory array comprising: a plurality of substantially coplanar first conductors extending in a first direction at a first height above a substrate; a plurality of substantially coplanar second conductors extending in a second direction different from the first direction, at a second height above the first height; a first plurality of pillars, each first pillar disposed between one of the first conductors and one of the second conductors; a first plurality of memory cells, wherein each first memory cell comprises a portion of one of the first conductors, a portion of one of the second conductors, and one of the first pillars, and wherein each first memory cell comprises chalcogenide material; a plurality of substantially coplanar third conductors extending in substantially the first direction, at a third height above the second height; a second plurality of pillars, each second pillar disposed between one of the second conductors and one of the third conductors; and a second plurality of memory cells, wherein each second memory cell comprises a portion of one of the second conductors, a portion of one of the third conductors, and one of the second pillars, and wherein each second memory cell comprises chalcogenide material, wherein the second conductors access both the first memory cells and second memory cells, wherein the first plurality of memory cells and the second plurality of memory cells are programmable read-only memory cells.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

While all materials can change phase, in this discussion the term "phase change material" will be used to describe a material that changes relatively easily from one stable state to another. The phase change is typically from an amorphous state to a crystalline state (or vice versa), but may be an intermediate change, such as from a less-ordered to a more ordered crystalline state, or vice versa. Chalcogenides are well-known phase change materials.

It is known to use phase change materials, such as chalcogenides, in a nonvolatile memory cell, in which a high-resistance, amorphous state represents one memory state while a low-resistance, crystalline state represents the other memory state, where memory states correspond to a value of 1 or 0. (If intermediate stable states are achieved, more than two memory states can exist for each cell; for simplicity, the examples in this discussion will describe only two memory states.) Chalcogenides are particularly useful examples of phase change materials, but it will be understood that other materials which undergo reliably detectable stable phase changes, such as silicon, silicon-germanium alloys, or germanium, can be used instead.

To convert a chalcogenide in a crystalline, low-resistance state to an amorphous, high-resistance state, the chalcogenide must be brought to a high temperature, for example about 700 degrees C., then allowed to cool quickly. The reverse conversion from an amorphous, high-resistance state to a crystalline, low-resistance state is achieved by heating to a lower temperature, for example about 600 degrees C., then allowing the chalcogenide to cool relatively slowly.

The high temperature required for the conversion is usually provided by a heater layer in close proximity to the chalcogenide layer. An appropriate material for a heater layer is a relatively high-resistance conductor which produces heat when a current flows through it. The heat is conducted to the chalcogenide, changing its phase.

The crystalline-to-amorphous transition, calling for a short, sharp pulse followed by rapid cooling, is the easier one to achieve. The lower pulse and slower cooling required to cause the amorphous-to-crystalline transition requires more careful control.

Figure 1:
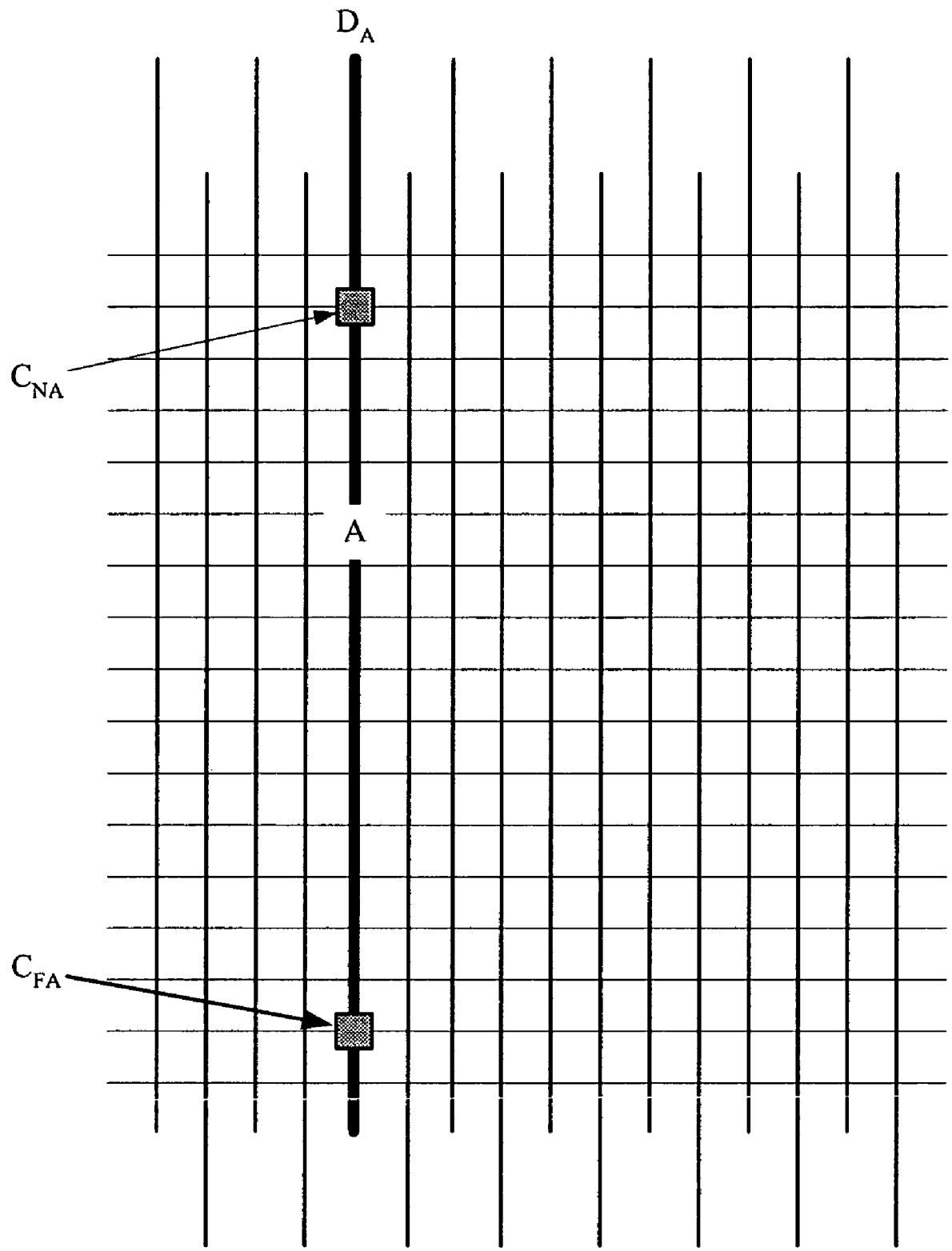
FIG. 1 is a plan view illustrating a "near cell", close to the driver, and a "far cell", more distant from the driver.

In memory arrays, cells are typically located at the intersection of wordlines and bitlines as shown in FIG. 1. A driver is located at one end of each bitline or wordline, and provides current when a cell is to be programmed. Memory cell $C_{NA}$ on bitline A is a "near bit", a cell that is relatively close to the driver $D_A$ on that line. Memory cell $C_{FA}$ on bitline A, which is relatively distant from the driver $D_A$, is a "far bit". Because of its short distance from driver $D_A$, the resistance between near bit $C_{NA}$ and driver $D_A$ is relatively low, while the resistance between far bit $C_{FA}$ and driver $D_A$ is relatively high. It is more difficult to reliably deliver a high current to far bit $C_{FA}$ than it is to deliver a high current to near bit $C_{NA}$.

As the number of cells in a memory array increases, it is more efficient to have more memory cells per bitline or wordline, reducing overhead. For a wordline or bitline with many cells, however, the problem of delivering consistent current to near cells and to far cells on that line becomes more acute. In a relatively large array of chalcogenide memory cells, then, it becomes difficult to reliably deliver the controlled pulse required to cause the amorphous-to-crystalline transition of the chalcogenide.

A memory array formed according to the present invention is a write-once array. In the initial, unprogrammed state the memory cells of this array are in the low-resistance, crystalline state. Cells are programmed by applying a short, sharp pulse, which is relatively easy to control, converting a programmed cell to the amorphous state. The programmed cells in the array are written only once, so the reverse transition, the more difficult amorphous-to-crystalline conversion, never needs to be performed, meaning that bitlines and/or wordlines can be long, and a large, efficient array of such cells can be formed.

Each cell in such an array is a phase change memory cell comprising a phase change element comprising a chalcogenide material, the phase change element having a programmed and an unprogrammed state, wherein the memory cell is a programmable read-only memory cell.

The array is considered write-once in that each cell can be programmed no more than once in normal operation. Any cell, or all of the cells in the memory, however, may undergo one or more amorphous-to-crystalline or crystalline-to-amorphous conversions during the controlled conditions of fabrication or testing. Further, after programming in the course of normal operation, an array can be returned to controlled conditions, in a factory or other manufacturer's or vendor's facility, to return the entire memory to the low-resistance, crystalline state, essentially erasing it. The circuitry on the die itself, however, is designed and sufficient to reliably execute only the crystalline-to-amorphous conversion in normal operation, not the reverse.

Thus a memory array according to an embodiment of the present invention can be formed and programmed by a method comprising forming an array of phase-change memory cells, each memory cells comprising a chalcogenide material, each memory cell having an unprogrammed state and a programmed state; factory-setting the memory cells of the array into the unprogrammed state; and field-programming some of the memory cells into the programmed state, wherein, during the operational lifetime of the array, none of the field-programmed cells is field-reset to the unprogrammed state. The step of factory-setting the memory cells of the array into the unprogrammed state may comprise a thermal anneal.

Circuit structures and methods suitable for use in three dimensional memory arrays formed according to the present invention are described in Scheuerlein, U.S. patent application Ser. No. 10/403,844, "Word Line Arrangement Having Multi-Layer Word Line Segments for Three-Dimensional Memory Array," filed Mar. 31, 2003, which is assigned to the assignee of the present invention and is hereby incorporated by reference. Beneficial elements of this arrangement include use of a common word line driver and very long bitlines allowing reduction in overhead circuitry.

Use of this beneficial circuit layout, and limiting the array to write-once use, allows the number of cells on a wordline or bitline to be 256 or greater, in some embodiments more than 1024, and in some embodiments at least 4096.

Preferred embodiments of the present invention, then, provide for a memory array comprising a first wordline or bitline; and a first plurality of memory cells on the wordline or bitline, wherein the memory cells comprise a chalcogenide material, wherein the plurality of memory cells comprises at least 256 memory cells. When such a memory array comprises stacked memory levels, the result is a monolithic three dimensional memory array comprising a first memory level, the first memory level comprising a first bitline or wordline, the first memory level comprising: a first plurality of phase change memory cells, each of the first plurality of cells comprising chalcogenide material, wherein the first plurality of memory cells comprises at least 256 memory cells; and a second memory level monolithically formed on the first memory level.

Any appropriate memory cell comprising a chalcogenide element in which the state of the chalcogenide corresponds to the memory state can be used in an array formed according to the present invention. Any of the cells described in the 11/040,255 application and the 11/040,465 application, both filed on even date herewith, for example, could be used in such an array.

The present invention proves especially useful in a monolithic three dimensional memory array, in which multiple memory levels are vertically stacked. Such arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; and Vyvoda et al., U.S. patent application Ser. No. 10/185,507, "Electrically Isolated Pillars in Active Devices," filed Jun. 27, 2002; Cleeves et al., U.S. patent application Ser. No. 10/185,508, "Three Dimensional Memory," filed Jun. 27, 2002; Herner et al., U.S. patent application Ser. No. 10/326,470, "An Improved Method for Making High Density Nonvolatile Memory," filed Dec. 19, 2002; and Herner et al., U.S. patent application Ser. No. 10/955,549, "Nonvolatile Memory Cell Without a Dielectric Antifuse Having High- and Low-Impedance States," filed Sep. 29, 2004, all assigned to the assignee of the present invention and all hereby incorporated by reference.

Figure 2A:
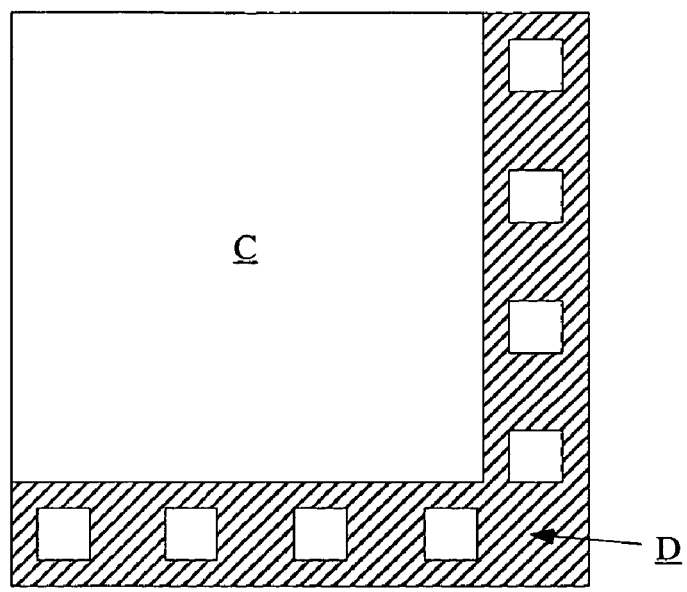
FIGS. 2a and 2b are plan views illustrating placement of device drivers for a single memory level and for multiple stacked memory levels.
Figure 2B:
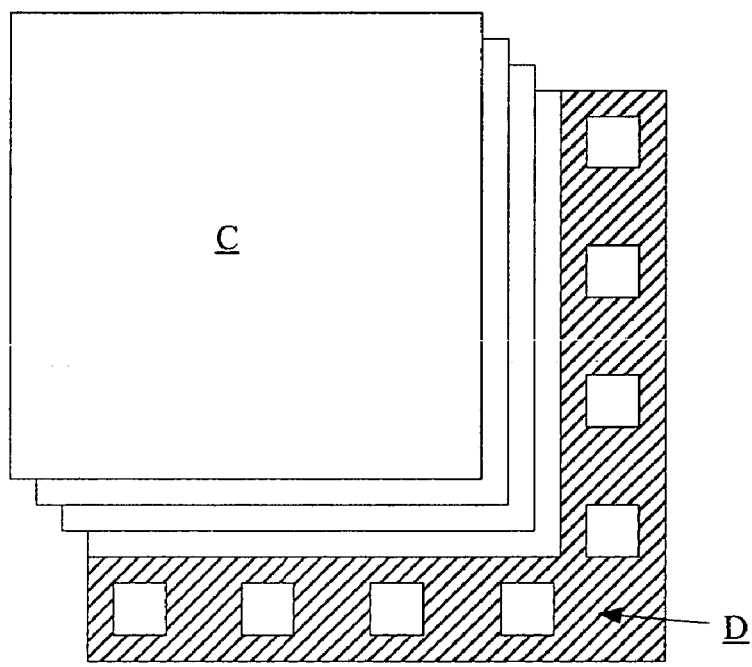

As shown in FIG. 2a, in conventional two-dimensional arrays, support circuitry for each bitline and each wordline is located at the end of the bitline or wordline in the border area D outside the array C, occupying valuable substrate area. When memory levels are stacked above the substrate, as in the above incorporated patents and applications, and as shown in FIG. 2b, driver circuitry for multiple memory levels must be located in this same border area D. It is true that the memory levels are formed entirely above the substrate, so the area under the memory cells is now available for other uses. Electrical connections should be kept as short as possible to minimize resistance, however, so this substrate area under the array, distant from wordline and bitline ends, cannot efficiently be used for device drivers. The drivers for multiple levels must thus all be packed into border area D. In three dimensional memories, then, it is especially critical to reduce the number of drivers required by increasing the number of cells on wordlines and bitlines.

A detailed example will be provided describing fabrication of a monolithic three dimensional memory array, the nonvolatile memory cells of the array formed according to one preferred embodiment of the present invention. For completeness, specific process conditions, dimensions, methods, and materials will be provided. It will be understood, however, that these details are not intended to be limiting, and that many of these details can be modified, omitted or augmented while the results still fall within the scope of the invention.

Fabrication

Fabrication of a single memory level will be described in detail. Additional memory levels can be stacked, each monolithically formed above the one below it.

Figure 3A:
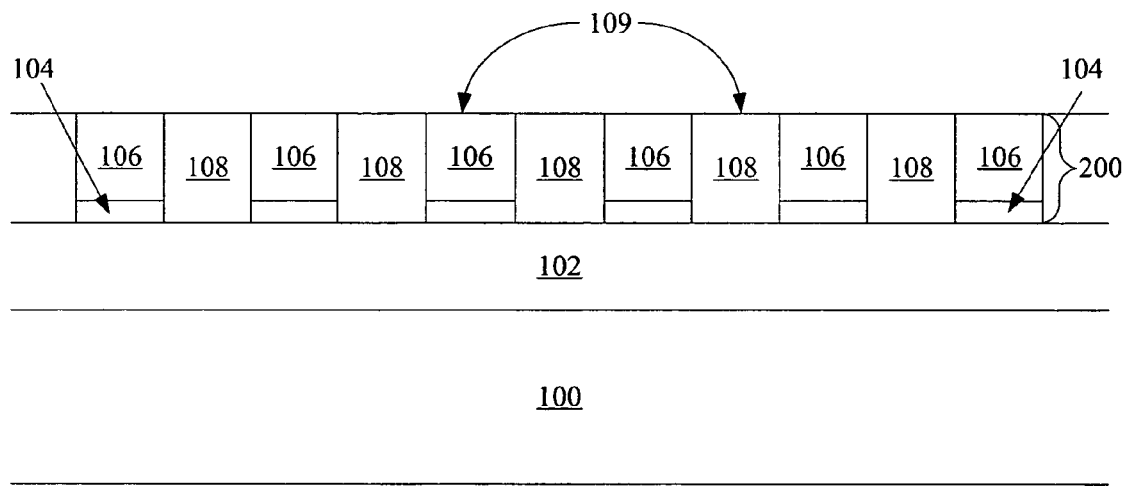
FIGS. 3a-3c are cross-sectional views illustrating stages of formation of a memory array formed according to a preferred embodiment of the present invention.

Turning to FIG. 3a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. Preferred materials for the adhesion layer 104 are tantalum nitride, tungsten nitride, titanium tungsten, tungsten, titanium nitride, or combinations of these materials. If the overlying conducting layer is tungsten, titanium nitride is preferred as an adhesion layer.

The next layer to be deposited is conducting layer 106. Conducting layer 106 can comprise any conducting material known in the art, including tantalum, titanium, tungsten, copper, cobalt, or alloys thereof. Titanium nitride may be used. Preferred materials for the conducting layer include a refractory metal or a refractory metal compound.

Once all the layers that will form the conductor rails have been deposited, the layers will be patterned and etched using any suitable masking and etching process to form substantially parallel, substantially coplanar conductors 200, shown in FIG. 3a in cross-section. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 3a. This removal of dielectric overfill to form planar surface 109 can be performed by any process known in the art, such as chemical mechanical planarization (CMP) or etchback. At this stage, a plurality of substantially parallel first conductors have been formed at a first height above substrate 100.

Figure 3B:
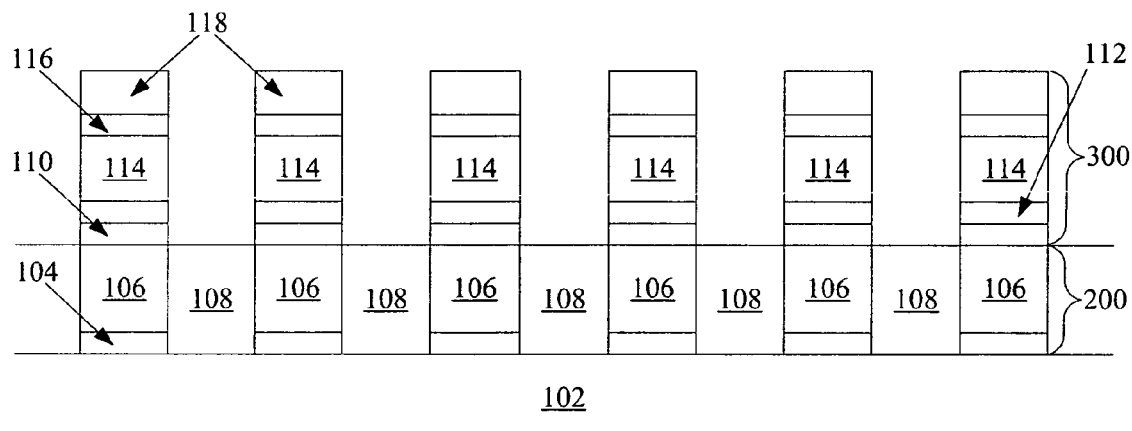

Next, turning to FIG. 3b, vertical pillars will be formed above completed conductor rails 200. (To save space substrate 100 is not shown in FIG. 3b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will form a diode is deposited. The semiconductor material can be silicon, silicon-germanium, silicon-germanium-carbon, germanium, or other suitable semiconductors or compounds. For simplicity, this description will refer to the semiconductor material as silicon, but it will be understood that other suitable materials may be substituted.

Figure 4:
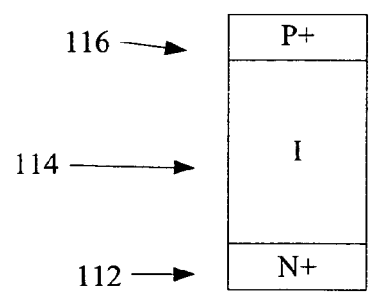
FIG. 4 is a cross-sectional view of an exemplary diode that may be present in a memory cell formed according to the present invention.

In preferred embodiments, the diode is a semiconductor junction diode. Turning to FIG. 4, a preferred junction diode has a bottom heavily doped region 112, intrinsic region 114, and top heavily doped region 116. The conductivity type of bottom region 112 and top region 116 are opposite: either region 112 is p-type while region 116 is n-type, or region 112 is n-type while region 116 is p-type. Middle region 114 is intrinsic, or not intentionally doped, though in some embodiments it may be lightly doped. An undoped region will never be perfectly electrically neutral, and will always have defects or contaminants that cause it to behave as if slightly n-doped or p-doped. Such a diode can be considered a p-i-n diode.

In FIG. 4, and in the exemplary array, bottom region 112 will be n-type while top region 116 is p-type. It will be understood that these conductivity types could be reversed. To form the diode of FIG. 4, bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon.

The next layer 114 will be intrinsic undoped silicon. This layer can formed by any deposition method known in the art. The thickness of the intrinsic silicon layer can range from about 1000 to about 4000 angstroms, preferably about 2500 angstroms. In one embodiment, silicon is deposited without intentional doping, yet has defects which render it slightly n-type.

Above this is a layer 116 of heavily doped p-type silicon. This layer is preferably deposited undoped, and will be doped by ion implantation. The thickness of heavily doped p-type silicon region 116 can range from about 100 to about 2000 angstroms, preferably about 800 angstroms. Layer 116 is doped by ion implantation, for example using boron.

Returning to FIG. 3b, next a heater layer 118 will be formed on layer 116. The heater layer should be formed of a relatively low thermal conductivity material. In preferred embodiments, heater layer 118 is formed of a refractory metal compound. Suitable materials for heater layer 118 would be any conductor having sheet resistance preferably between about 100 kiloOhm/□ and about 1 kiloOhm/□. Examples are titanium nitride, tungsten nitride, and tantalum nitride. In this example, layer 118 is formed of titanium nitride.

Finally, heater layer 118, semiconductor layers 116, 114 and 112, and underlying barrier layer 110 will all be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed.

Figure 3C:
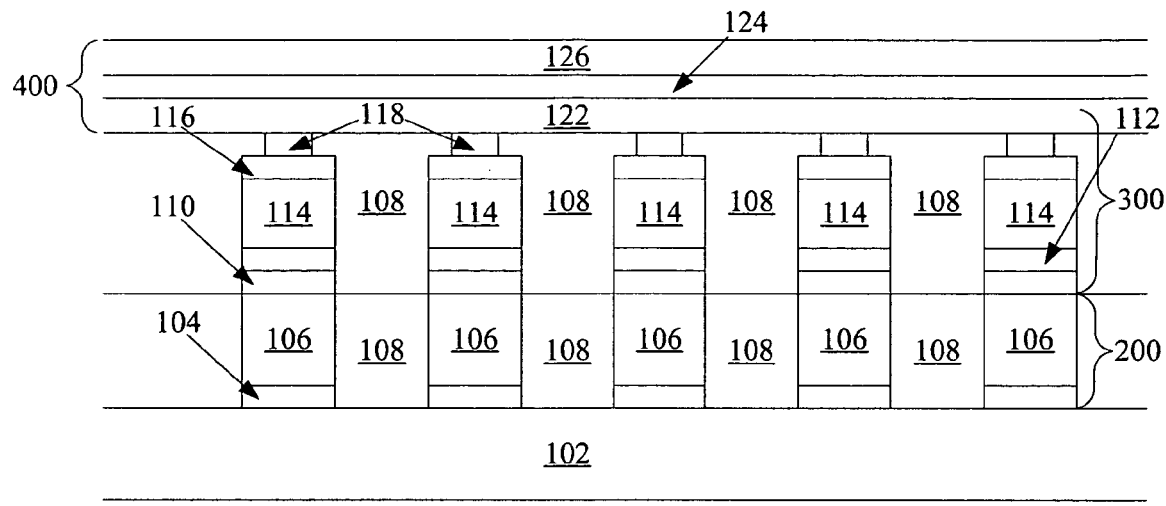

In preferred embodiments, as shown in FIG. 3c, after pillars 300 have been formed, an additional selective etch can be formed that will selectively and laterally etch heater layer 118, narrowing its cross section, while minimally etching the other layers in pillars 30. In other embodiments the lateral etch need not be selective. This lateral etch will reduce the contact area between heater layer 118 and an overlying phase change element (yet to be formed), focusing heat and aiding in affecting the phase change. This technique is described more fully in the 11/040,465 application, filed on even date herewith.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the top surfaces of heater layers 118 separated by dielectric material 108, and leaving a substantially planar surface. This removal of dielectric overfill can be performed by any process known in the art, such as CMP or etchback.

Turning to FIG. 3c, a layer 122 of a phase change material, preferably a chalcogenide material, is formed. Layer 118 will serve as a heater layer, heating a portion of phase change layer 122 to cause it to undergo a desired phase change. Layer 122 can be any chalcogenide material, for example any suitable compound of germanium (Ge), antimony (Sb) and tellurium (Te); such a compound is referred to as a GST material. A GST material that may advantageously be employed in memory applications, as in memory cells formed according to the present invention, is $Ge_2Sb_2Te_5$. Phase change layer 122 can be formed by an conventional method.

In preferred embodiments a thin barrier layer 124 is formed on phase change layer 122. Barrier layer 124 provides a barrier between phase change layer 122 and conductive layer 126. Conductive layer 126 is formed of a conductive material, for example tungsten or titanium tungsten.

Phase change material layer 122, barrier layer 124, and conductive layer 126 are then patterned and etched using any suitable masking and etching process to form substantially parallel, substantially coplanar conductors 400, shown in FIG. 3c extending left-to-right across the page, substantially perpendicular to first conductors 200. In one embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Additional Memory Levels

This structure, shown in FIG. 3c, is a first memory level comprising memory phase change memory cells. Each phase change memory cell comprises a first conductor and a second conductor, a phase change element disposed between the first conductor and the second conductor. The cell further comprises a diode disposed between the phase change element and the first conductor or between the phase change element and the second conductor.

This array is formed by a method comprising forming a plurality of first substantially parallel, substantially coplanar conductors at a first height above a substrate; forming a plurality of second substantially parallel, substantially coplanar conductors at a second height above the first height; forming a plurality of first phase change elements, each comprising a chalcogenide material and disposed between one of the first conductors and one of the second conductors; and forming a plurality of first programmable read-only memory cells, wherein each memory cell comprises a) a portion of one of the first conductors; b) a portion of one of the second conductors; and c) one of the first phase change elements.

Additional memory levels can be monolithically formed above a first memory level to form a monolithic three dimensional memory array. A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 5A:
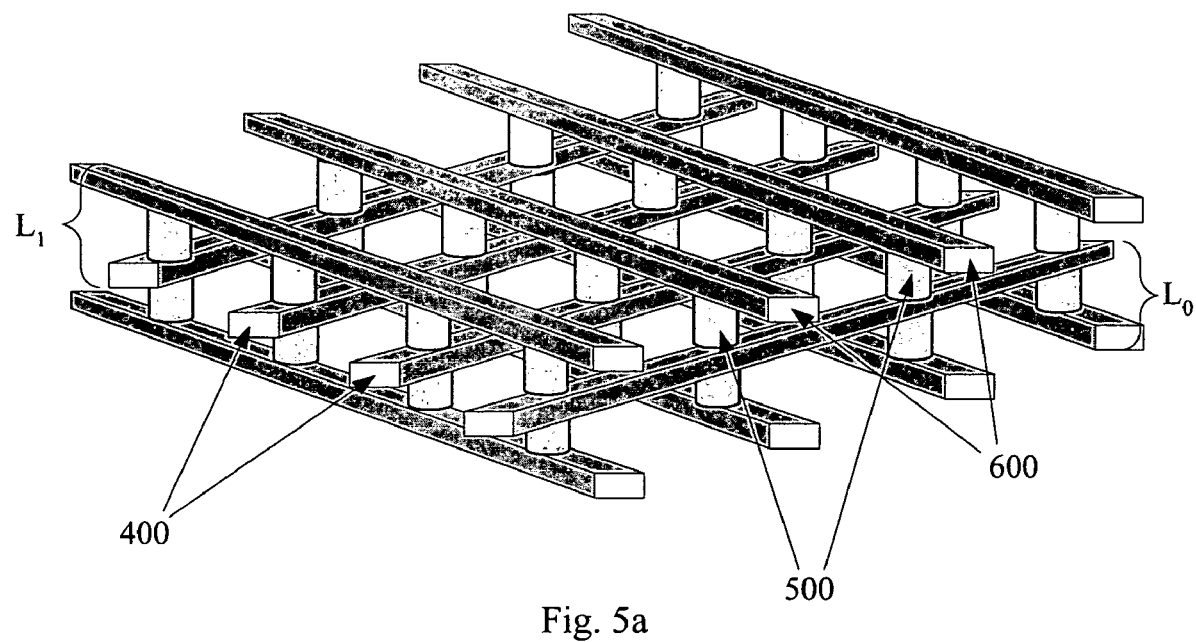
FIG. 5a is a perspective view of stacked memory levels with conductors shared between adjacent memory levels according to a preferred embodiment of the present invention.

A second memory level can be formed above the first memory level just described. In one configuration, top conductors 400 can be shared between adjacent memory levels. Turning to FIG. 5a, if top conductors 400 are to be shared, after planarization second pillars 500 are formed in the same manner as were the first pillars 300, each on one of the conductors 400. A third plurality of substantially parallel, substantially coplanar conductors 600, preferably substantially perpendicular to second conductors 400, is formed above second pillars 500. It will be seen that conductors 400 belong to both memory level $L_0$ and to memory level $L_1$. In this case, in preferred embodiments, the p-i-n diodes in the second pillars 500 may be upside down relative to the p-i-n diodes of first pillars 300; eg if, in first pillars 300, the bottom heavily doped region is n-type and the top heavily doped region is p-type, then in second pillars 500 the bottom heavily doped region may be p-type while the top heavily doped region is n-type.

Figure 5B:
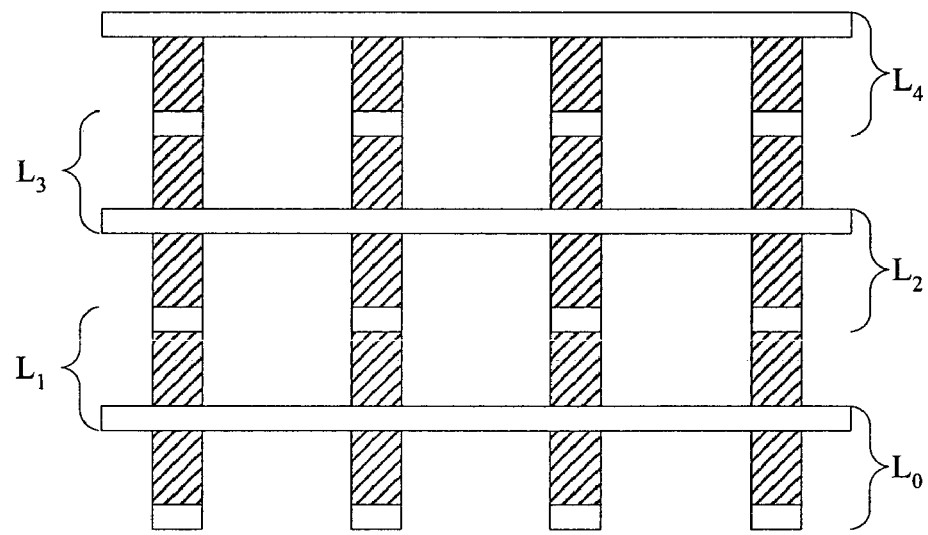
FIG. 5b is a cross-sectional view of several stacked memory levels of such an array.

FIG. 5b shows five memory levels in cross section, illustrating how this scheme can be extended for several stacked levels. One plurality of conductors is shared between $L_0$ and $L_1$, a different plurality of conductors is shared between $L_1$ and $L_2$, etc.

In a preferred embodiment, second pillars 500 are "upside-down" relative to first pillars 300, such that if, in first pillars 300 the bottom heavily doped region is n-type while the top heavily doped region is p-type, in second pillars that polarity is reversed, and the bottom heavily doped region us p-type, while the top heavily doped region is n-type.

Figure 6A:
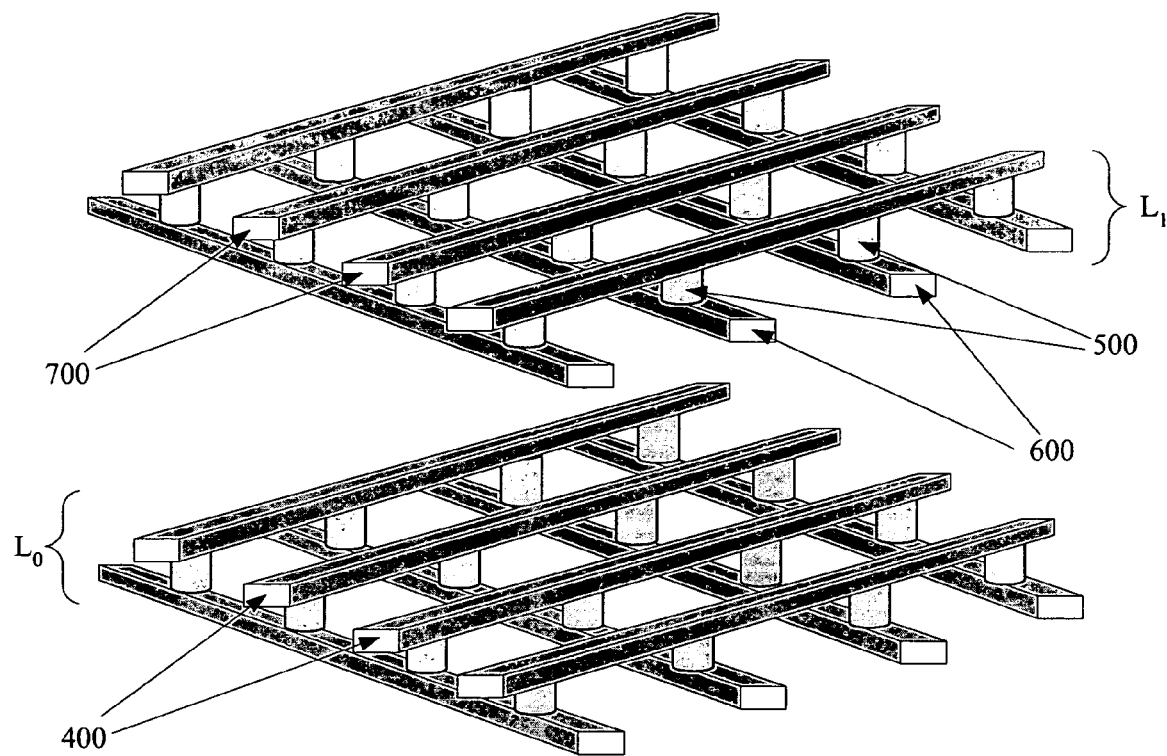
FIG. 6a is a perspective view of stacked memory levels with conductors not shared between adjacent memory levels according to a preferred embodiment of the present invention.
Figure 6B:
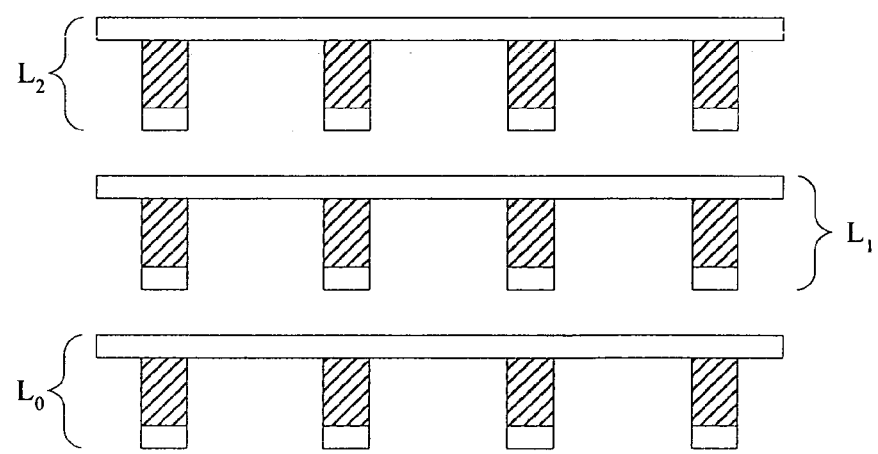
FIG. 6b is a cross-sectional view of several stacked memory levels of such an array.

Alternatively, turning to FIG. 6a, an interlevel dielectric (not shown) can be formed between adjacent memory levels. In this case third conductors 600 are formed above the interlevel dielectric, second pillars 500 formed above third conductors 600, and fourth conductors 700 formed above second pillars 500. Conductors 400 belong to memory level $L_0$ only, while conductors 600 and 700 belong to memory level $L_1$. No conductors are shared between memory levels. FIG. 6b show a cross-sectional view of an array in which this scheme is extended for three memory levels. No conductors are shared between memory levels $L_0$ and $L_1$, or between memory levels $L_1$ and $L_2$. If desired, adjacent memory levels sharing conductors and adjacent memory levels not sharing conductors can be stacked in the same monolithic three dimensional memory array.

Figure 7A:
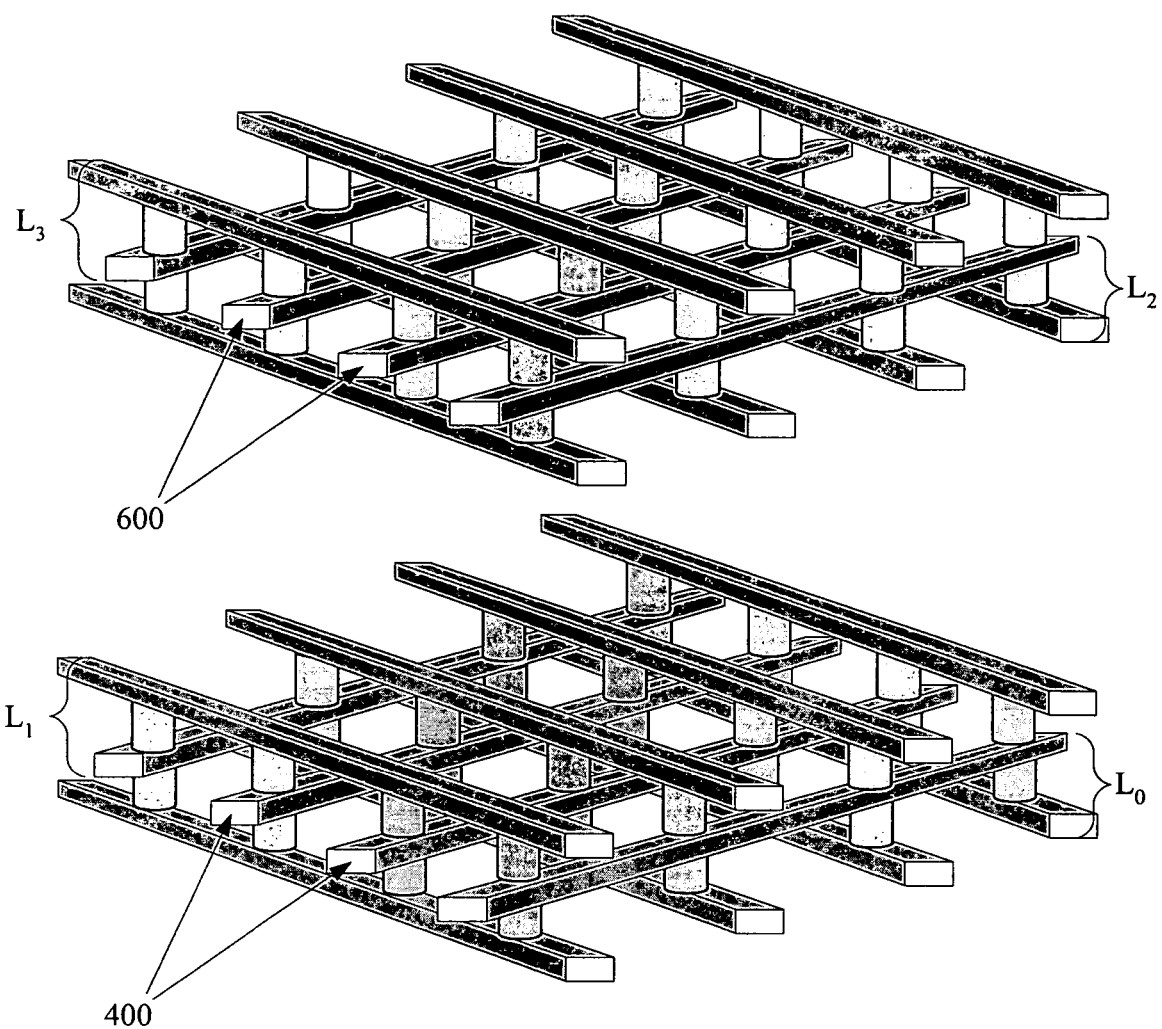
FIG. 7a is a perspective view of stacked memory levels with conductors shared between some adjacent memory levels and not shared between other adjacent memory levels according to a preferred embodiment of the present invention.
Figure 7B:
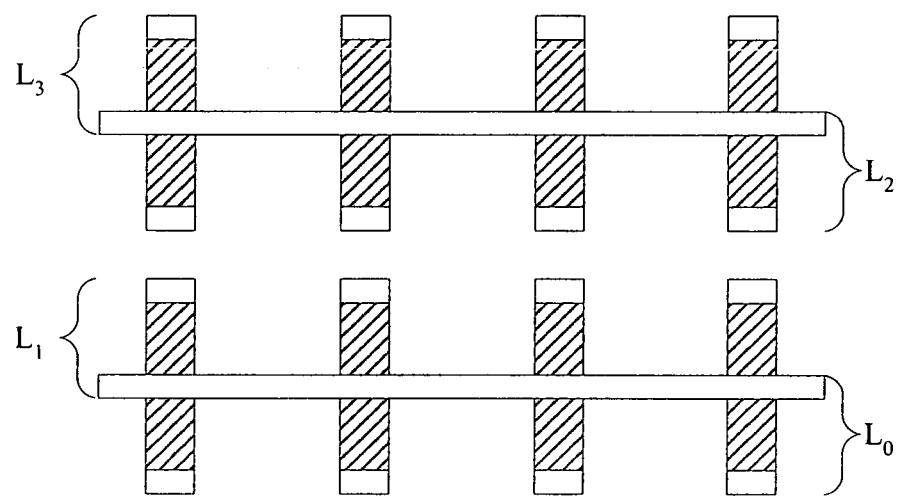
FIG. 7b is a cross-sectional view of such an array.

In another embodiment, some conductors may be shared while others are not. FIG. 7a shows a memory array in which conductors 400 are shared between memory levels $L_0$ and $L_1$, and conductors 600 are shared between memory levels $L_2$ and $L_3$. No conductors are shared between memory levels $L_1$ and $L_2$, however. FIG. 7b shows a cross-sectional view of such an array.

Memory levels $L_0$ and $L_1$ of FIG. 7a and 7b belong to a monolithic three dimensional memory array, the array comprising a plurality of substantially coplanar first conductors extending in a first direction at a first height above a substrate; a plurality of substantially coplanar second conductors extending in a second direction different from the first direction, at a second height above the first height; a first plurality of pillars, each first pillar disposed between one of the first conductors and one of the second conductors; a first plurality of memory cells, wherein each first memory cell comprises a portion of one of the first conductors, a portion of one of the second conductors, and one of the first pillars, and wherein each first memory cell comprises chalcogenide material; a plurality of substantially coplanar third conductors extending in substantially the first direction, at a third height above the second height; a second plurality of pillars, each second pillar disposed between one of the second conductors and one of the third conductors; and a second plurality of memory cells, wherein each second memory cell comprises a portion of one of the second conductors, a portion of one of the third conductors, and one of the second pillars, and wherein each second memory cell comprises chalcogenide material, wherein the second conductors access both the first memory cells and second memory cells, and wherein the first plurality of memory cells and the second plurality of memory cells are programmable read-only memory cells.

Other configurations can be envisioned, and fall within the scope of the present invention.

Any of these configurations comprises a monolithic three dimensional memory array comprising a first memory level comprising a plurality of memory cells, each memory cell having a programmed state and an unprogrammed state and comprising a phase change element, each phase change element comprising chalcogenide material, wherein the memory cells are programmable read-only memory cells; and at least a second memory level monolithically formed on the first memory level.

Memory levels need not all be formed having the same style of memory cell. If desired, memory levels using phase change materials can alternate with memory levels using other types of memory cells. In other embodiments, write-many phase change memory cells can be combined with programmable read-only memory cells on the same memory level. For example, a memory level may include write-once memory cells as part of the main memory array, as well as an additional small array or arrays of write-many phase-change non-volatile memory cells. The small arrays can be as small as one individual cell connected to circuitry. The rewriteable cells are arranged in arrays sufficiently small that the pulses used to set the cells to the low resistance state can be adequately controlled to achieve this more difficult conversion. These small arrays can be used, for example, for auxiliary purposes: as trim bits or to provide redundancy.

To summarize, such an array is a monolithic three dimensional memory array comprising a) a first memory level formed above a substrate, the first memory level comprising: i) a first plurality of write-once memory cells, each memory cell of the first plurality comprising chalcogenide material; and ii) a second plurality of rewriteable memory cells, each memory cell of the second plurality comprising chalcogenide material; and b) a second memory level monolithically formed above the first memory level.

While the structure of the arrays just described diverges in some important ways from the structure of the array of the Herner et al. applications, wherever they are the same, the fabrication methods of Herner et al. can be used. For clarity, not all of the fabrication details of Herner et al. were included in this description, but no part of that description is intended to be excluded.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Many variations on the example provided can be imagined. For example, each of the memory cells described includes a non-ohmic conductive element, the p-i-n diode, to serve as an isolation device. A non-ohmic conductive element is characterized by a non-linear current vs. voltage curve. Other non-ohmic elements may be used in place of a diode. For example, a metal-insulator-metal device consists of two metal (or metal-like) layers separated by a very thin insulator layer. When sufficient voltage is applied, charge carriers can tunnel across the insulator layer, but do not permanently damage it, as in an antifuse. In alternative embodiments of the present invention, the diode of the memory cells just described could be replaced with a MIM device.

In other alternative embodiments of the present application, memory cells may exist at the intersections of rails, as in the memories described in Knall et al., the rails modified to comprise the heater layer and a layer of phase change material. In still other alternative embodiments, as in Vyvoda et al., a pillar is formed at the intersection of two rails, a first portion of a diode in the rail, and a second portion in the pillar. The embodiment of Vyvoda et al. could be modified to include phase change and heater layers according to the present invention. Advantageous choices of diode and memory line polarities for use in such an array are described in more detail in Scheuerlein et al., U.S. Pat. No. 6,822,903, "Apparatus and Method for Disturb-Free Programming of Passive Element memory Cells," hereby incorporated by reference.

Scheuerlein, U.S. patent application Ser. No. 11/930,620, a related application filed on even date herewith, teaches a biasing scheme that could advantageously be used in an array formed according to the present invention. The biasing scheme of this application guarantees that the voltage across unselected and half-selected cells is not sufficient to cause inadvertent conversion of those cells, and allows precise control of the power delivered to the cell to be programmed.

The Johnson et al., Knall et al., Johnson, Vyvoda et al., and Herner et al. applications owned by the assignee of the present application and earlier incorporated by reference described monolithic three dimensional memory arrays. Any of these various monolithic three dimensional memory arrays can be modified by the methods of the present invention to form a one-time-programmable nonvolatile memories having a phase change material such as a chalcogenide.

The present invention has been described herein in the context of a monolithic three dimensional memory array formed above a substrate. Such an array comprises at least a first memory level formed at a first height above the substrate and a second memory level formed at a second height different from the first height. Three, four, eight, or indeed any number of memory levels can be formed above the substrate in such a multilevel array. Alternatively, a memory array comprising memory cells formed according to the present invention need not be formed in a three dimensional array, and could be a more conventional two dimensional array formed without stacking.

Detailed methods of fabrication have been described herein, but any other methods that form similar structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A phase change memory device, comprising:
   one or more phase change memory cells, the individual phase change memory cells comprising a chalcogenide material; and
   a programming circuit coupled to said one or more phase change memory cells, wherein during normal operation, said programming circuit allows execution of only crystalline-to-amorphous conversions to occur in said one or more phase change memory cells.

2. The phase change memory device of claim 1, wherein said one or more phase change memory cells further comprise a plurality of phase change memory cells.

3. The phase change memory device of claim 2, wherein the individual phase change memory cells further comprise a diode in series with said chalcogenide material.

4. The phase change memory device of claim 3, wherein said chalcogenide material is a GST material.

5. The phase change memory device of claim 4, wherein the GST material is $Ge_2Sb_2Te_5$.

6. The phase change memory device of claim 3, wherein the individual phase change memory cells are disposed between a first conductor and a second conductor.

7. The phase change memory device of claim 6, wherein said first conductor is formed above a substrate and said second conductor is formed above said first conductor.

8. The phase change memory device of claim 7, wherein said first conductor extends in a first direction and said second conductor extends in a second direction, the second direction substantially perpendicular to the first direction.

9. The phase change memory device of claim 8, wherein said diode is a p-i-n diode.

10. The phase change memory device of claim 9, wherein said diode resides in a vertically oriented pillar.

11. The phase change memory device of claim 8, wherein said first conductor comprises a refractory metal or a refractory metal compound.

12. The phase change memory device of claim 11, wherein the refractory metal or refractory metal compound is tungsten or titanium tungsten.

13. A monolithic integrated circuit, comprising:
a first layer and a second layer of phase change memory cells, the individual phase change memory cells comprising a chalcogenide material in series with a diode, said second layer disposed above said first layer; and
an operational circuit located on the monolithic integrated circuit coupled to said first layer, wherein during the operational lifetime of the monolithic integrated circuit said operational circuit allows only crystalline-to-amorphous conversion of said first layer phase change memory cells.

14. The monolithic integrated circuit of claim 13, wherein said first layer of phase change memory cells is factory-set into the crystalline state.

15. The monolithic integrated circuit of claim 13, wherein said chalcogenide material is a GST material.

16. The monolithic integrated circuit of claim 15, wherein the GST material is $Ge_2Sb_2Te_5$.

17. The monolithic integrated circuit of claim 16, wherein said diode is a p-i-n diode.

18. The monolithic integrated circuit of claim 17, wherein said diode resides in a vertically oriented pillar.

19. The monolithic integrated circuit of claim 13, further comprising a third layer and a fourth layer of phase change memory cells, said third layer disposed above said second layer, said fourth layer disposed above said third layer.

20. The monolithic integrated circuit of claim 19, wherein the first layer, second layer, and third layer of phase change memory cells individually comprise a plurality of top conductors and a plurality of bottom conductors, said plurality of top conductors disposed above said plurality of bottom conductors.

21. The monolithic integrated circuit of claim 20, wherein said plurality of top conductors of said first layer also form said plurality of bottom conductors of said second layer, and said plurality of top conductors of said second layer also form said plurality of bottom conductors of said third layer.

22. The monolithic integrated circuit of claim 21, wherein a programmed state of the individual phase change memory cells is a high resistance state, the chalcogenide material in a programmed state is in an amorphous state, and the chalcogenide material in an unprogrammed state is in a crystalline state.

23. The monolithic integrated circuit of claim 20, wherein said plurality of top conductors of said first layer are separate from said plurality of bottom conductors of said second layer.

24. The monolithic integrated circuit of claim 23, wherein a programmed state of the individual phase change memory cells is a high resistance state, the chalcogenide material in a programmed state is in an amorphous state, and the chalcogenide material in an unprogrammed state is in a crystalline state.

25. The monolithic integrated circuit of claim 20, wherein said plurality of top conductors of said first layer also form said plurality of bottom conductors of said second layer, and said plurality of top conductors of said second layer are separate from said plurality of bottom conductors of said third layer.

26. The monolithic integrated circuit of claim 25, wherein a programmed state of the individual phase change memory cells is a high resistance state, the chalcogenide material in a programmed state is in an amorphous state, and the chalcogenide material in an unprogrammed state is in a crystalline state.

* * * * *